United States Patent
Smith et al.

(10) Patent No.: US 9,077,322 B2
(45) Date of Patent: Jul. 7, 2015

(54) RING OSCILLATOR TIMER CIRCUIT

(71) Applicant: Tektronix, Inc., Beaverton, OR (US)

(72) Inventors: Patrick A. Smith, Beaverton, OR (US); Daniel G. Knierim, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 49 days.

(21) Appl. No.: 13/928,889

(22) Filed: Jun. 27, 2013

(65) Prior Publication Data

US 2014/0049328 A1 Feb. 20, 2014

Related U.S. Application Data

(60) Provisional application No. 61/691,166, filed on Aug. 20, 2012.

(51) Int. Cl.
*H03K 3/03* (2006.01)

(52) U.S. Cl.
CPC ............ *H03K 3/0315* (2013.01); *H03K 3/0322* (2013.01)

(58) Field of Classification Search
CPC .................................................... H03K 3/0315
USPC .......................................................... 331/57
See application file for complete search history.

(56) References Cited

U.S. PATENT DOCUMENTS

| | | | |
|---|---|---|---|
| 5,627,500 A | 5/1997 | Wolaver | |
| 6,411,244 B1 | 6/2002 | Dobos | |
| 7,548,127 B2 * | 6/2009 | Morini et al. | 331/57 |
| 7,567,136 B2 * | 7/2009 | Osvaldella | 331/57 |
| 7,679,458 B2 * | 3/2010 | Malik | 331/57 |
| 7,705,687 B1 * | 4/2010 | Paz | 331/57 |
| 8,072,275 B1 | 12/2011 | Paz | |
| 8,279,015 B2 * | 10/2012 | Leistad et al. | 331/57 |
| 2002/0130694 A1 * | 9/2002 | Fang | 327/277 |
| 2005/0248414 A1 | 11/2005 | Osvaldella | |
| 2006/0197608 A1 | 9/2006 | Sanchez | |

OTHER PUBLICATIONS

European Search Report from EP Application No. 13179634.4, dated Nov. 22, 2013, 8 pages.

* cited by examiner

*Primary Examiner* — Ryan Johnson
(74) *Attorney, Agent, or Firm* — Marger Johnson & McCollom PC

(57) ABSTRACT

A ring oscillator timer circuit can include a plurality of electrical components arranged in a cascaded combination of delay stages connected in a closed loop chain. The timer circuit can begin oscillation a programmable number of gate delays after receiving a start signal. In some examples, the number of gate delays can be programmed to fractional values. In further examples, the ring oscillator timer circuit can include a counter having an input electrically coupled to an output of a reset component.

4 Claims, 4 Drawing Sheets

RING OSCILLATOR TIMER CIRCUIT

CROSS-REFERENCE TO RELATED APPLICATION

The present application claims the benefit of U.S. Provisional Patent Application Ser. No. 61/691,116, filed Aug. 20, 2012, which is fully incorporated by reference herein.

TECHNICAL FIELD

The present disclosure relates generally to timer circuits used with oscilloscopes. In particular, timer circuits capable of being programmed with minimum resolution times and faster reset intervals are described.

BACKGROUND

Known timer circuits are not entirely satisfactory for the range of applications in which they are employed. For example, existing timer circuits are incapable of being programmed for fractional time delays. In addition, conventional timer circuits typically have long reset intervals.

To date, the most used advanced trigger modes in oscilloscopes are the Glitch or Pulse Width trigger modes, in which an input pulse is qualified as a trigger event based on its width as compared to one or more reference timers. The critical performance parameters for these trigger modes using a reference timer circuit are the minimum timer setting and the minimum timer reset interval. The increased demand for higher bit rates has driven the next generation of timer circuit requirements to be on the order of ten times faster than the present designs.

Examples of references relevant to addressing these problems can be found in the following U.S. Patent references: U.S. Pat. No. 6,515,550, U.S. Pat. No. 5,355,097, U.S. Publication 2008/0001677, and U.S. Publication 2006/0232346. However, each of these references suffers from one or more of the following disadvantages: slow circuit reset times and the inability to program the circuit for fractional time delays.

Thus, there exists a need for timer circuits that improve upon and advance the design of known timer circuits. Examples of new and useful timer circuits relevant to the needs existing in the field are discussed below.

SUMMARY

Embodiments of the disclosed technology generally include systems and devices for improved ring oscillator timer circuits. Embodiments may include multiplexers, NAND gates, or NOR gates arranged in a cascaded combination of delay stages connected in a closed loop chain. Certain embodiments may also include a counter used for long-term delays and a plurality of fractional multiplexers that allow the timer circuit to be programmed for fractional periods of a clock cycle.

DETAILED DESCRIPTION

The disclosed timer circuits will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations may be contemplated for different applications and design considerations. Throughout the following detailed description, examples of various timer circuits are provided. Related features in the examples may be identical, similar, or dissimilar in different examples.

Embodiments generally include a phase-startable ring oscillator having an output at which is produced an oscillator signal. Ring oscillators typically include a series of electrical components, e.g., multiplexers or logic gates, that are electrically coupled in such a manner that they together form a closed loop.

According to embodiments, a ring oscillator generally has a first input receiving a start control signal to control the onset of oscillation from a static state, and also a second input receiving control data that control the generation of a predetermined signal level at the output during the static state, and select an initial gate delay of the oscillator signal from a predetermined set of selectable initial gate delays. In response to the start signal, the oscillator continues to generate the predetermined signal level at the output for the selected gate delay time, and begins oscillation thereafter.

As described below, the ring oscillator may include various types of logic elements or other electrical components such as NAND gates, NOR gates, multiplexers, or any suitable combination thereof. Also, the ring oscillator may also include at least one inverting stage. For embodiments including multiple inverting stages, there will generally be an odd number of inverting stages.

Figure 1A:
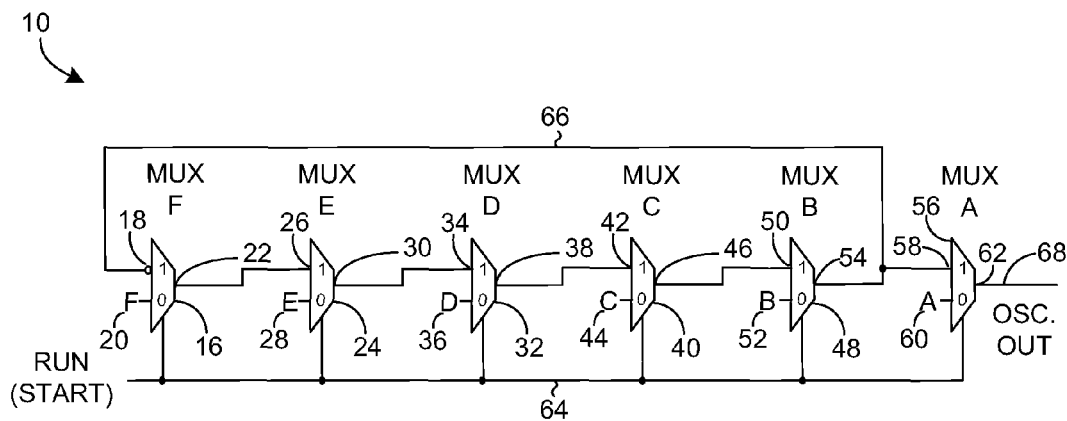
FIG. 1A illustrates a schematic view of a first embodiment of a ring oscillator timer circuit in accordance with certain embodiments of the disclosed technology.

With reference to FIG. 1A, a first example of a timer circuit 10 will now be described. Timer circuit 10 includes a first multiplexer 16 (MUX F), a second multiplexer 24 (MUX E), a third multiplexer 32 (MUX D), a fourth multiplexer 40 (MUX C), a fifth multiplexer 48 (MUX B), and a sixth multiplexer 56 (MUX A), arranged in a cascaded combination of delay stages and connected in a closed loop chain, otherwise known as a ring-oscillator configuration. Timer circuit 10 functions to provide a programmable timer for use with a variety of different oscilloscope triggering modes.

With continuing reference to FIG. 1A, first MUX F 16 further includes an inverted input 18, a second input 20 (F) configured to receive a first logic level input, a common start input 64, and an output 22. Second MUX E 24 further includes a first input 26 that is electrically coupled to the output 22 of MUX F 16, a second input 28 (E) configured to receive a second logic level input, a common start input 64, and an output 30. Third MUX D 32 further includes a first input 34 that is electrically coupled to the output 30 of MUX E 24, a second input 36 (D) configured to receive a third logic level input, a common start input 64, and an output 38. Fourth MUX C 40 further includes a first input 42 that is electrically coupled to the output 38 of MUX D 32, a second input 44 (C) configured to receive a fourth logic level input, a common start input 64, and an output 46. Fifth MUX B 48 further includes a first input 50 that is electrically coupled to the output 46 of MUX C 40, a second input 52 (B) configured to receive a fifth logic level input, a common start input 64, and an output 54. Sixth MUX A 56 further includes a first input 58 that is electrically coupled to the output 54 of MUX B 48, a second input 60 (A) configured to receive a sixth logic level input, a common start input 64, and an output 62. Output 54 of MUX B 48 is electrically coupled 66 to the inverted input 18 of MUX F 16. Additionally, output 62 of MUX A 56 is an oscillator output signal (OSC. OUT) 68 that is sent on for use with other areas of the digital oscilloscope.

Alternatively, a timer circuit may be configured with additional multiplexers beyond the five that are shown cascaded together in FIG. 1A. Further, a timer circuit may also be configured with fewer multiplexers than the five that are shown cascaded together in FIG. 1A.

Figure 1B:
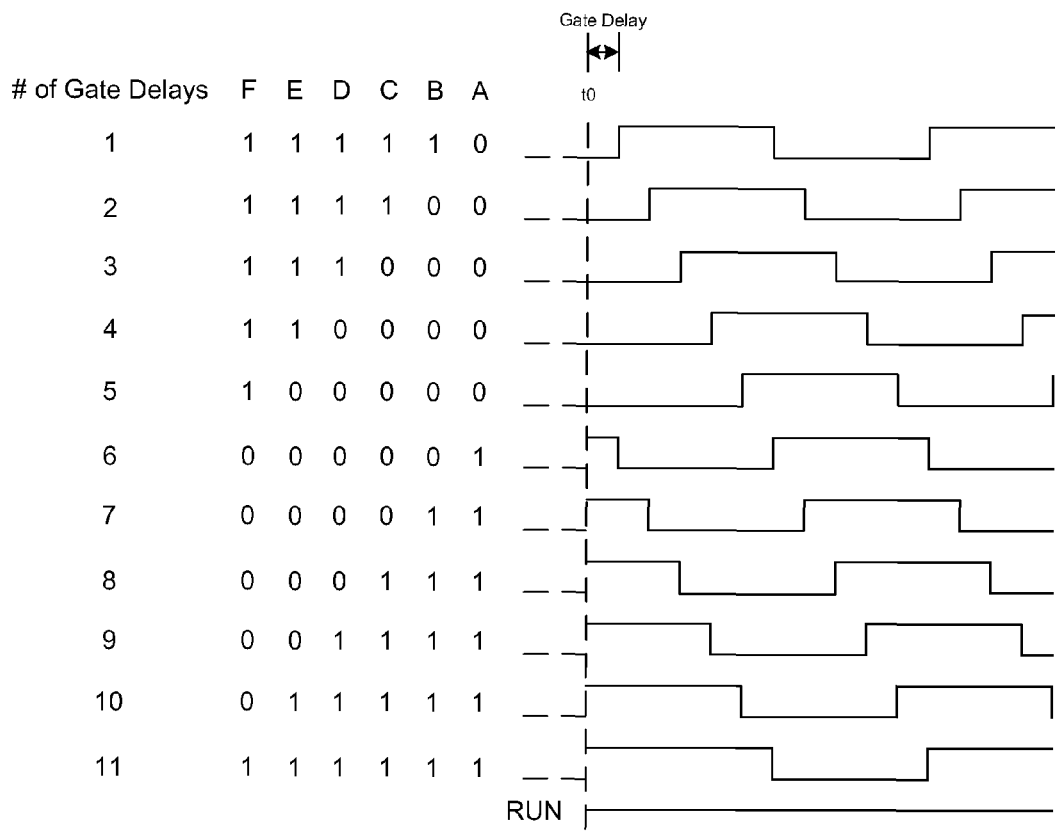
FIG. 1B illustrates a timing diagram of the ring oscillator timer circuit illustrated in FIG. 1A.

Turning attention to FIG. 1B, operation of timer circuit 10 will now be described. A single control signal (RUN) 64 is used to start, stop, and reset timer circuit 10 as each of the common inputs 64 of each of MUX A 56 though MUX F 16 are electrically coupled to the RUN signal 64. When RUN signal 64 is at a logic-level high, timer circuit 10 will oscillate as each first input (26, 34, 42, 50) of MUX E 24 though MUX B 48, respectively, is electrically coupled to outputs (22, 30, 38, 46) of MUX F 16 through MUX C 40, respectively. Further, output 54 of MUX B 48 is electrically coupled to inverted input 18 of MUX F 16 in order to satisfy a ring configuration.

Next, when RUN signal 64 is at a logic-level low, timer circuit 10 will reset to a predetermined state as each of MUX F 16 through MUX A 56 is now monitoring its second input (20, 28, 36, 44, 52, 60), respectively. Further, each of MUX F 16 through MUX A 56 is capable of receiving an independently programmed logic-level input on its second input (20, 28, 36, 44, 52, 60), respectively.

Next, when RUN signal 64 is at a logic-level high, a delay time for a first rising edge of timer circuit 10 to appear at an oscillator output 68 is dependent upon a preset state of timer circuit 10. With all five second inputs (52, 44, 36, 28, 20) of MUX B 48 through MUX F 16 (48, 40, 32, 24, 16), respectively, in the ring configuration programmed to a logic-level high, oscillator output 68 will be a logic-level high one gate delay after RUN signal 64 is at a logic-level high.

However, if for example, second inputs (60, 52) of MUX A 56 and MUX B 48, respectively, are programmed to a logic-level low, and second inputs (44, 36, 28, 20) of MUX C 40 through MUX F 16, respectively, are programmed to a logic-level high, then oscillator output 68 will be a logic-level high two gate delays after RUN signal 64 is at a logic-level high. This timing pattern can be carried forward for each additional delay that is desired out of timer circuit 10 as illustrated in FIG. 1B. Further, if each gate delay were approximately 10 picoseconds in duration, and with five multiplexors/stages in this embodiment, timer circuit 10 will operate with a timer resolution of approximately 10 picoseconds covering a 100-picosecond range with a period of approximately 100 picoseconds.

Figure 2:
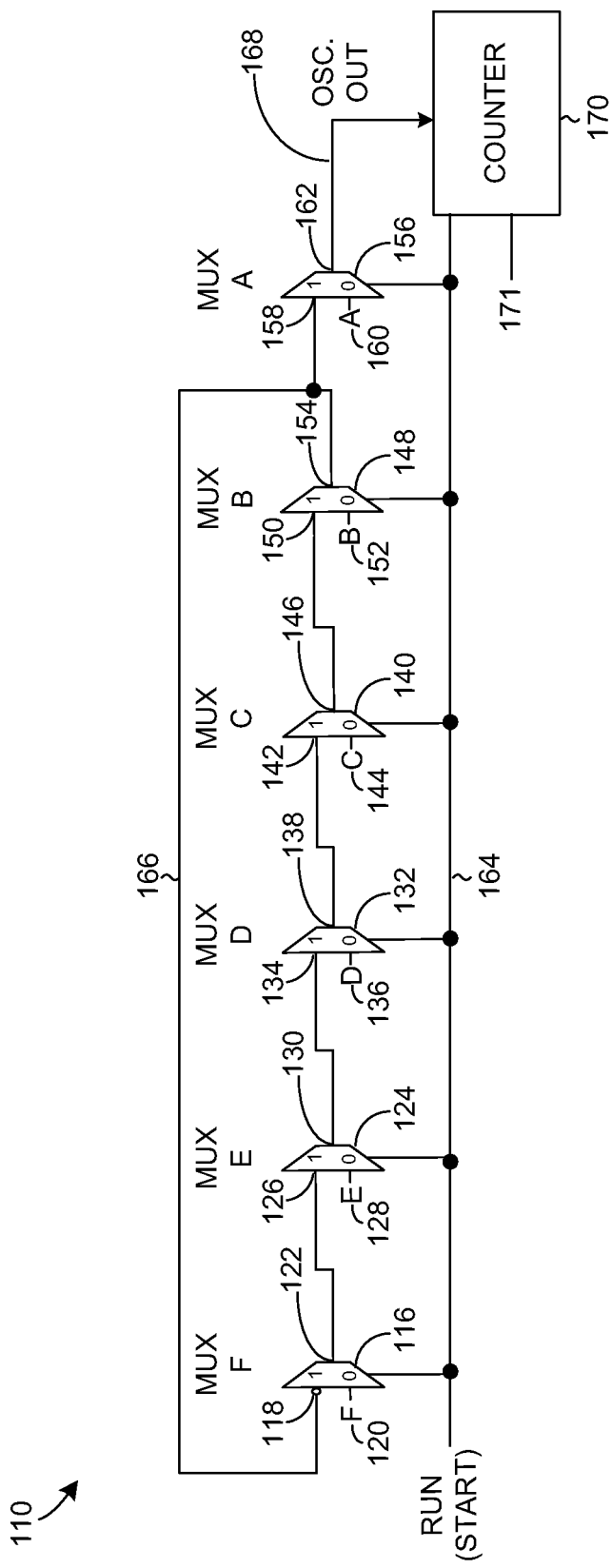
FIG. 2 illustrates a schematic view of a second embodiment of a ring oscillator timer circuit including a counter in accordance with certain embodiments of the disclosed technology.

Turning attention to FIG. 2, a second example of a timer circuit 110 will now be described. Timer circuit 110 includes many similar or identical features to timer circuit 10. Timer circuit 110 includes a first multiplexer 116 (MUX F), a second multiplexer 124 (MUX E), a third multiplexer 132 (MUX D), a fourth multiplexer 140 (MUX C), a fifth multiplexer 148 (MUX B), and a sixth multiplexer 156 (MUX A), arranged in a cascaded combination of delay stages and connected in a closed loop chain 166, otherwise known as a ring-oscillator configuration Timer circuit 110 further includes a counter 170. Counter 170 is electrically coupled to output 162 of MUX A 156. The RUN signal 164 is also provided as an input to the counter 170 as an active-low reset signal, and is used to place the counter, as well as the ring oscillator, in a known initial state. A control input 171 to the counter 170 is used to control this initial state.

As previously stated, because timer circuit 110 also has five multiplexers/stages, it will also have a 10 picosecond resolution; however, with counter 170 now electrically coupled to output 162, counter 170 can be used to provide arbitrarily longer timer values with the same 10 picosecond resolution.

Figure 3:
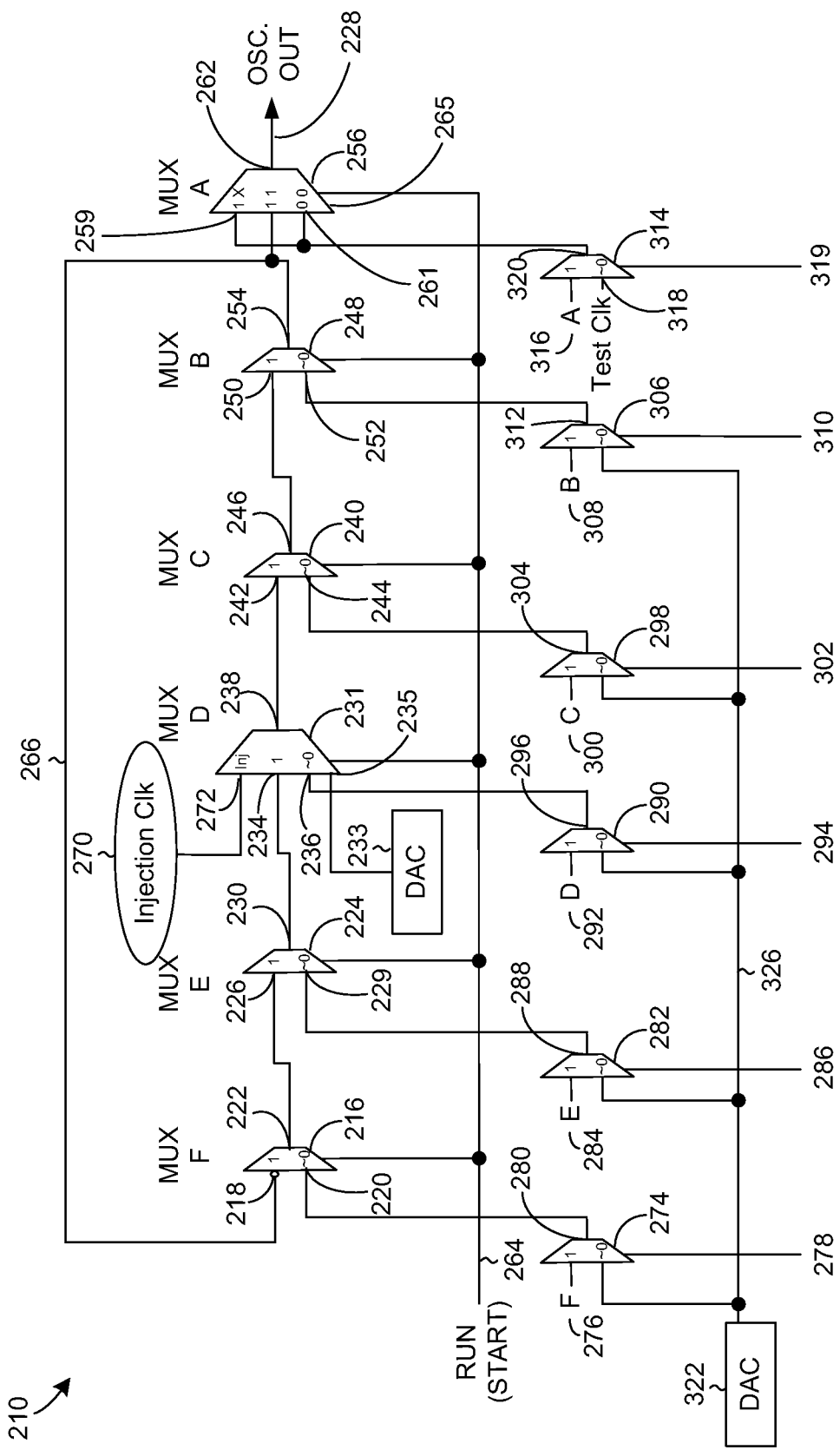
FIG. 3 illustrates a schematic view of a third embodiment of a ring oscillator timer circuit including a plurality of fractional multiplexers in accordance with certain embodiments of the disclosed technology.

Turning attention to FIG. 3, a third example of a timer circuit 210 will now be described. Timer circuit 210 includes a first multiplexer 216 (MUX F), a second multiplexer 224 (MUX E), a fourth multiplexer 240 (MUX C), a fifth multiplexer 248 (MUX B), and a sixth multiplexer 256 (MUX A), arranged in a cascaded combination of delay stages and connected in a closed loop chain, otherwise known as a ring-oscillator configuration. Timer circuit 210 further includes a plurality of fractional multiplexers (274, 282, 290, 298, 306), an injection multiplexer 231, a test multiplexer 314, an injection Digital-Analog-Converter (DAC) 233, and a fine-voltage DAC 322.

The plurality of fractional multiplexers (274, 282, 290, 298, 306) may be used to improve the 10 picosecond minimum resolution time below one gate delay. Additionally, injection multiplexer 231 operates functionally the same as MUX F 216 through MUX B 248, with one additional feature: it has signal-injection capabilities. Injection multiplexer 231 includes a first input 234, an injection input 272, a third input 236, a fourth input 235, and an output 238. The additional inputs to injection multiplexer 231 relative to other components in timer circuit 210 will be described in detail below.

MUX 274 includes a first input 276 (F), a common second input 326, a control bit input 278, and an output 280 that is electrically coupled to second input 220 of MUX F 216. MUX 282 includes a first input 284 (E), a common second input 326, a control bit input 286, and an output 288 that is electrically coupled to second input 229 of MUX E 224. MUX 290 includes a first input 292 (D), a common second input 326, a control bit input 294, and an output 296 that is electrically coupled to third input 236 of signal-injection multiplexer 231. MUX 298 includes a first input 300 (C), a common second input 326, a control bit input 302, and an output 304 that is electrically coupled to second input 244 of MUX C 240. MUX 306 includes a first input 308 (B), a common second input 326, a control bit input 310, and an output 312 that is electrically coupled to second input 252 of MUX B 248.

Test multiplexer 314 includes a first input 316 (A), a Test Clk input 318, a select input 319, and an output 320 that is electrically coupled to second input 259 and third input 261 of MUX A 256. When test multiplexer receives a programmed logic-level low on select input 319 and a test clock on input 318, the test clock can be passed to the oscillator output 228 in order to test the functionality of downstream circuitry, such as counter 170 from FIG. 2.

Continuing with FIG. 3, the 10-picosecond minimum resolution time can be reduced to "fractional" time values below a single gate delay. For example, a reset value applied to the common second inputs 326 of the fractional multiplexers (274, 282, 290, 298, 306), respectively, can be set to a "fractional" logic value by fine-voltage DAC 322. One of the outputs (280, 288, 296, 304, 312) of the corresponding fractional multiplexers may be selected to pass this "fractional" logic value to a corresponding second input (220, 229, 236, 244, 252) of MUX F 216 through MUX B 248, respectively, causing a "fractional" gate delay for that MUX during onset of oscillation of timer circuit 210.

In one example with the input 261 of MUX A 256 set to a logic-level zero, a programmed "fractional" logic-level 0.7 from fine-voltage DAC 322 passed through fractional multiplexer 306 to input 252 of MUX B 248, and fractional multiplexers 274, 282, 290, and 298 selecting a high logic level, timer circuit 210 will generate a high output 1.3 gate delays (0.3 gate delays for MUX B to go from 0.7 to 1, then 1 gate delay for MUX A to go from 0 to 1) after RUN signal 264 becomes a high logic level. In general, any one fractional multiplexer (274, 282, 290, 298, 306) may select the "fractional" logic level from fine-voltage DAC 322 as the initial state level for the corresponding ring multiplexer, while the remaining fractional multiplexers will select logic zeroes on one side of the fractional level and logic ones on the other side.

"Fractional" logic levels as used herein are not defined in terms of a linear voltage mapping between logic 0 and logic 1, but rather a linear mapping of the effective delay time through a selected multiplexer based on its starting voltage. Additionally or alternatively, the circuit timer may have a separate fine-voltage DAC feeding each of the second inputs of its respective ring multiplexers (216, 224, 231, 240, 248) instead of just a single fine-voltage DAC performing that function. The initial states of the ring multiplexers may thus be programmed with logic zeroes and ones, with an optional "fractional" value at the zero to one boundary. In certain embodiments, for example, this can be done with five DACs feeding the ring directly or with a single DAC and fractional multiplexers to select which one of the ring multiplexers receives the DAC output.

As can be seen in FIG. 3, injection-signal multiplexer 231 may be used to ensure long-term accuracy of timer circuit 210. For example, rather than synchronizing RUN signal 264 to a crystal-controlled oscillator (not shown), the crystal-controlled oscillator signal can be injected as an injection clock signal 270 directly into injection input 272 of injection-signal multiplexer 231. Injection DAC 233 provides an electrical current to fourth input 235 of multiplexer 231. This variable electric current may be used to control the amount of injection clock signal 270 that is allowed into multiplexer 231, ultimately determining the robustness of the injection-locking effect on timer circuit 210. In fact, timer circuit 210 will start at a programmed phase on a rising edge of RUN signal 264 but, due to the injection-locking effect, will shift its phase and frequency slowly over time to align with the injected crystal-controlled clock. Increased current from injection DAC 233 will allow for greater long-term stability of timer circuit 210 as the injection-locking effect is proportional to this increased current.

Injection clock 270 may be switched OFF for shorter time settings (to avoid any jitter from the injection-locking induced phase shift) and switched ON for longer timer settings of timer circuit 210. Alternatively, use of a DAC to allow a programmable injection amplitude could be implemented as well. This would allow software to calibrate the injection level to minimize injection-locking-induced jitter while still guaranteeing sufficient injection to provide the desired frequency clock. Further, software could program a gradual increase in the injection amplitude as a function of the time setting, thus avoiding any "step-function" change in behavior between the short-term unlocked and long-term injection-locked modes of operation.

Figure 4:
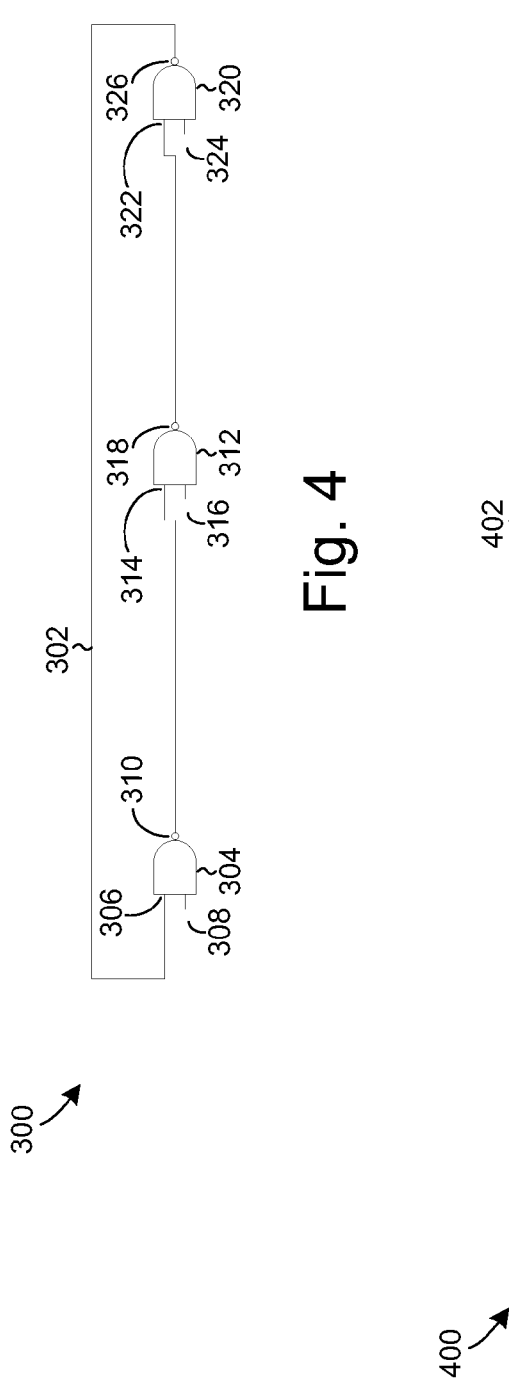
FIG. 4 illustrates a schematic view of a fourth embodiment of a ring oscillator timer circuit in accordance with certain embodiments of the disclosed technology.

Turning attention to FIG. 4, a fourth example of a timer circuit will 300 now be described. Timer circuit 300 includes a first electrical component 304 having a first input 306, a second input 308, and an inverted output 310, and a second electrical component 312 having a first input 314, a second input 316, and an inverted output 318. The timer circuit 300 also includes a final electrical component 320 having a first input 322, a second input 324, and an inverted output 326. As in previously described embodiments, the ring-oscillation configuration of timer circuit 300 is implemented by having inverted output 326 of final electrical component 320 electrically coupled 302 with first input 306 of first electrical component 304. The timing aspects of timer circuit 300 work similarly to the previously described embodiments of the disclosed technology. Additionally, while timer circuit 300 is constructed with NAND gates, other timer circuits may be constructed using NOR gates. Further, other examples of timer circuits may include more than two electrical components.

Figure 5:
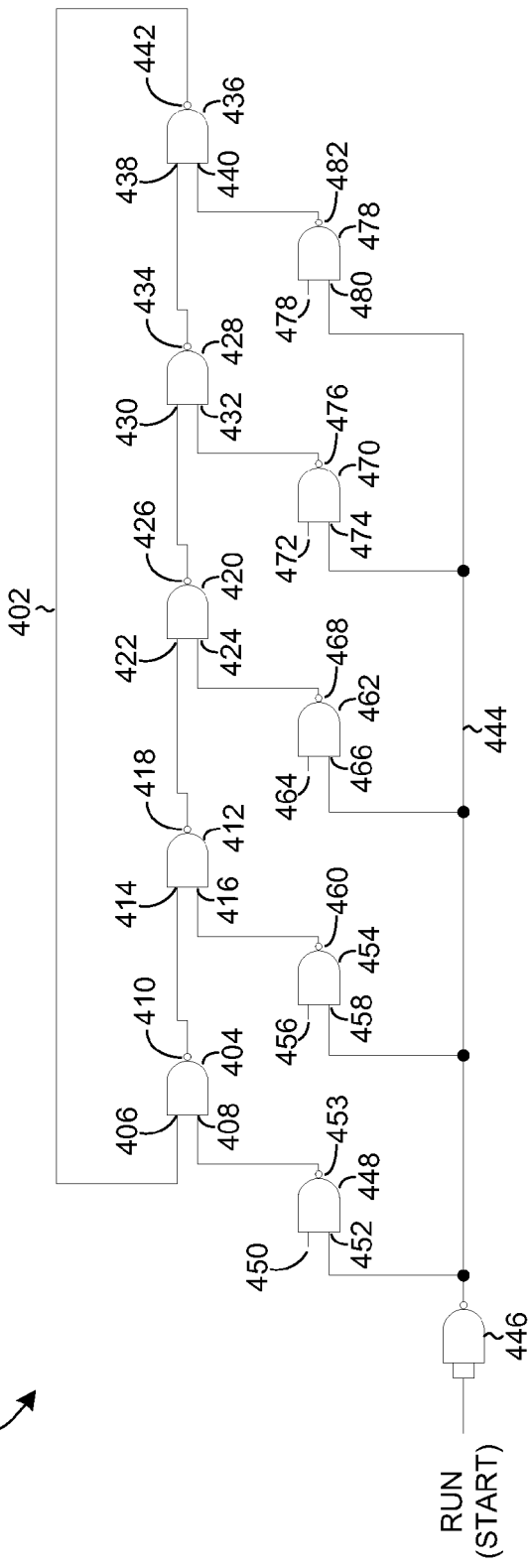
FIG. 5 illustrates a schematic view of a fifth embodiment of a ring oscillator timer circuit in accordance with certain embodiments of the disclosed technology.

Turning attention to FIG. 5, a fifth example of a timer circuit will now be described. Timer circuit 400 is similar to the previously described timer circuit 300 in that the same ring-oscillation configuration is implemented as well as timer circuit 400 operating with the same timing aspects as disclosed above. However, timer circuit 400 also includes additional circuitry that provides for better resolution, similar to timer circuit 210 above.

Timer circuit 400 includes a plurality of electrical of electrical components: a first electrical component 404, a second electrical component 412, a third electrical component 420, a fourth electrical component 428, and a final electrical component 436, arranged in a cascaded combination of delay stages and connected in a closed loop chain 402, otherwise known as a ring-oscillator configuration.

As described in earlier embodiments of the disclosed technology, each of the plurality of electrical components (404, 412, 420, 428, 436) includes a corresponding first input (406, 414, 422, 430, 438), a second input (408, 416, 424, 432, 440), and an inverted output (410, 418, 426, 434, 442), respectively. The respective inverted outputs (410, 418, 426, 434) are electrically coupled to the first inputs (414, 422, 430, 438) of the next electrical component in the delay stage. However, the last inverted output 442 of the final electrical component 436 is electrically coupled 402 back to the first input 406 of the first electrical component 404, thereby completing the closed loop ring-oscillation configuration. Again, the timing aspects of timer circuit 400 are similar to that of timer circuit 210 as previously described above.

Timer circuit 400 further includes a plurality of fractional electrical components (448, 454, 462, 470, 478), a control electrical component 446, and a common Run/Start line 444. Fractional electrical components (448, 454, 462, 470, 478) function to provide increased resolution as well as starting-point programmability for the desired timed delays.

Each of the fractional electrical components (448, 454, 462, 470, 478) are configured respectively with a corresponding first input (450, 456, 464, 472, 478), a second input (452, 458, 466, 474, 480), and an inverted output (453, 460, 468, 476, 482). As can be seen in FIG. 5, each of the inverted outputs (453, 460, 468, 476, 482) of the fractional electrical components (448, 454, 462, 470, 478), are electrically coupled to the second inputs (408, 416, 424, 432, 440) of the electrical components (404, 412, 420, 428, 436), respectively.

Again, as disclosed above with timer circuit 210, these fractional electrical components provide greater resolution and programmability for the disclosed technology.

The control electrical component 446, when enabled, functions to provide a Run/Start signal 444 to each of the second inputs (452, 458, 466, 474, 480) of each of the fractional electrical components (448, 454, 462, 470, 478), respectively. When the Run/Start signal 444 is enabled, each of the fractional electrical elements will receive this enabling signal; however, only one of the first inputs (450, 456, 464, 472, 478) will have its input passed through its respective fractional electrical component (448, 454, 462, 470, 478) and on to one of the electrical components (404, 412, 420, 428, 436) in the ring-oscillator configured circuit described previously. Additionally, while timer circuit 400 is constructed with NAND gates, other timer circuits may be constructed using NOR gates. Further, other examples of timer circuits may include more or less electrical components than what is described in the present embodiment of the disclosed technology.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

We claim:

1. A phase-startable ring oscillator having an output at which is produced an oscillator signal, comprising:
    a first input receiving a start control signal to control the onset of oscillation from a static state;
    a second input receiving control data that control the generation of a predetermined signal level at the output during the static state, and select an initial gate delay of the oscillator signal from a predetermined set of selectable initial gate delays;
    a first plurality of multiplexers; and
    a second plurality of multiplexers coupled with the first plurality of multiplexers, wherein the second plurality of multiplexers are fractional multiplexers and the gate delay time has a fractional value, and further wherein the fractional multiplexers are configured to receive a signal from a digital-to-analog converter;
    wherein, in response to the start signal, the oscillator continues to generate the predetermined signal level at the output for the selected gate delay time, and begins oscillation thereafter.

2. A phase-startable ring oscillator having an output at which is produced an oscillator signal, comprising:
    a first input receiving a start control signal to control the onset of oscillation from a static state; and
    a second input receiving control data that control the generation of a predetermined signal level at the output during the static state, and select an initial gate delay of the oscillator signal from a predetermined set of selectable initial gate delays;
    a first plurality of multiplexers; and
    a plurality of digital-to-analog converters (DACs) coupled with the first plurality of multiplexers, wherein the gate delay time has a fractional value;
    wherein, in response to the start signal, the oscillator continues to generate the predetermined signal level at the output for the selected gate delay time, and begins oscillation thereafter.

3. A phase-startable ring oscillator having an output at which is produced an oscillator signal, comprising:
    a first input receiving a start control signal to control the onset of oscillation from a static state;
    a second input receiving control data that control the generation of a predetermined signal level at the output during the static state, and select an initial gate delay of the oscillator signal from a predetermined set of selectable initial gate delays;
    a first plurality of multiplexers; and
    a counter receiving the oscillator signal, wherein the control data further determine the state of the counter during the static state prior to onset of oscillation;
    wherein, in response to the start signal, the oscillator continues to generate the predetermined signal level at the output for the selected gate delay time, and begins oscillation thereafter.

4. A phase-startable ring oscillator having an output at which is produced an oscillator signal, comprising:
    a first input receiving a start control signal to control the onset of oscillation from a static state;
    a second input receiving control data that control the generation of a predetermined signal level at the output during the static state, and select an initial gate delay of the oscillator signal from a predetermined set of selectable initial gate delays;
    a third input receiving an injection clock signal; and
    a fourth input controlling the amplitude of the injection clock signal injected into the ring oscillator;
    wherein, in response to the start signal, the oscillator continues to generate the predetermined signal level at the output for the selected gate delay time, and begins oscillation thereafter.

* * * * *